United States Patent
Wu et al.

(10) Patent No.: US 6,861,749 B2
(45) Date of Patent: Mar. 1, 2005

(54) SEMICONDUCTOR DEVICE WITH BUMP ELECTRODES

(75) Inventors: Chia-Hui Wu, Tainan (TW);
Biing-Seng Wu, Tainan (TW);
Ying-Chou Tu, Tainan (TW)

(73) Assignee: Himax Technologies, Inc., Tainan (TW)

( * ) Notice: Subject to any disclaimer, the term of this patent is extended or adjusted under 35 U.S.C. 154(b) by 255 days.

(21) Appl. No.: 10/247,553

(22) Filed: Sep. 20, 2002

(65) Prior Publication Data

US 2004/0056351 A1 Mar. 25, 2004

(51) Int. Cl.[7] .............................................. H01L 23/48
(52) U.S. Cl. ...................... 257/737; 257/750; 257/758; 257/786
(58) Field of Search ................... 257/737, 750, 257/758, 786

(56) References Cited

U.S. PATENT DOCUMENTS 6,445,001 B2 * 9/2002 Yoshida ....................... 257/48
2002/0100975 A1 * 8/2002 Kanda ......................... 257/737
2002/0121692 A1 * 9/2002 Lee et al. .................... 257/737
2002/0149086 A1 * 10/2002 Aoki ........................... 257/528
2003/0067073 A1 * 4/2003 Akram et al. ................ 257/738

* cited by examiner

Primary Examiner—Nathan J. Flynn
Assistant Examiner—Pershelle Greene
(74) Attorney, Agent, or Firm—Finnegan, Henderson, Farabow, Garrett & Dunnner. L.L.P.

(57) ABSTRACT

A semiconductor device comprises a substrate having contact pads each covered by under bump metallurgy and a plurality of bump electrodes respectively provided on the under bump metallurgy covering the contact pads. According to one embodiment of the present invention, the semiconductor device is characterized by having at least one contact pad (e.g., a test contact pad) which is not provided with any bump electrode but still has under bump metallurgy provided thereon. According to another embodiment of the present invention, the semiconductor device is characterized by having at least a conductive line formed of the same material as the under bump metallurgy for interconnecting at least two of the contact pads. The present invention further provides methods of manufacturing the semiconductor devices.

17 Claims, 12 Drawing Sheets

FIG. 8a (PROIR ART)

FIG. 8b (PROIR ART)

FIG. 8c (PROIR ART)

FIG. 8d (PROIR ART)

FIG. 8e (PROIR ART)

FIG. 8f (PROIR ART)

SEMICONDUCTOR DEVICE WITH BUMP ELECTRODES

BACKGROUND OF THE INVENTION

1. Field of the Invention

This invention relates to a semiconductor device and a method of manufacturing the same, and more specifically to a semiconductor device having a plurality of bump electrodes.

2. Description of the Related Art

As the requirements for smaller and thinner electronic devices increase, the velocity and the complexity of IC chips have become more and more higher. Accordingly, a need has arisen for higher package efficiency. Demand for miniaturization is the primary catalyst driving the usage of advanced packages such as tape carrier packages (TCP) commonly used in the manufacture of liquid crystal display (LCD) modules. The tape carrier package generally comprises a semiconductor device having bump electrodes for driving the LCD panel. Moreover, the semiconductor device having bump electrodes are also used in chip on glass (COG) technology, which permits direct attachment of chips to a glass substrate.

Figure 8A:
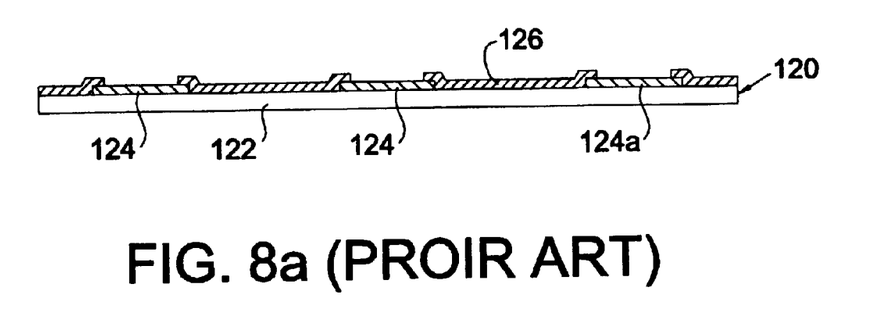
FIGS. 8a–8f illustrate in cross-section major steps of fabrication of a conventional semiconductor device.
Figure 8B:
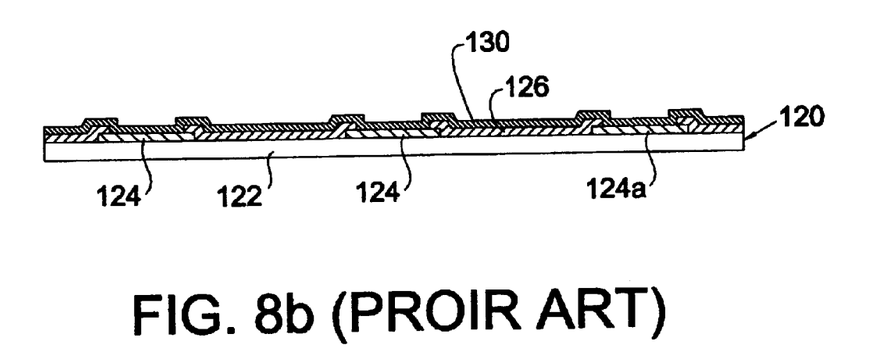
Figure 8C:
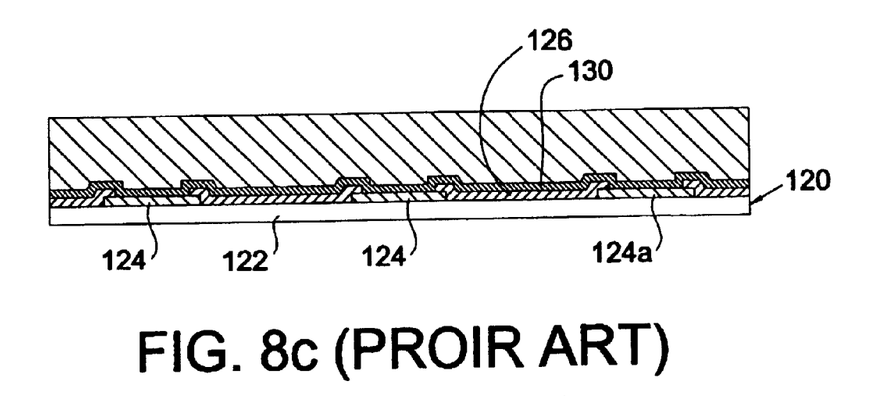
Figure 8D:
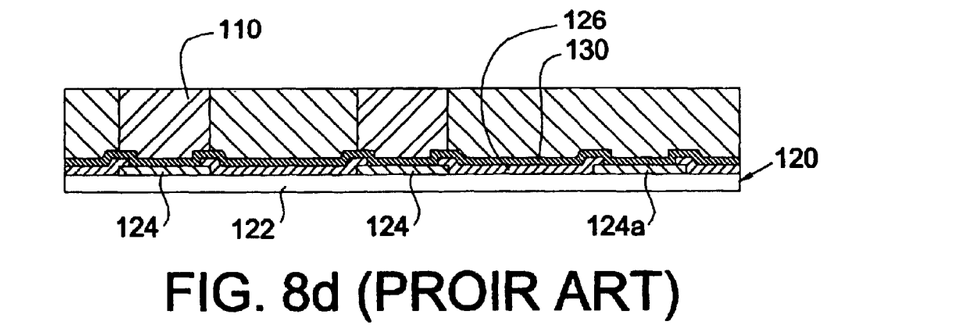
Figure 8E:
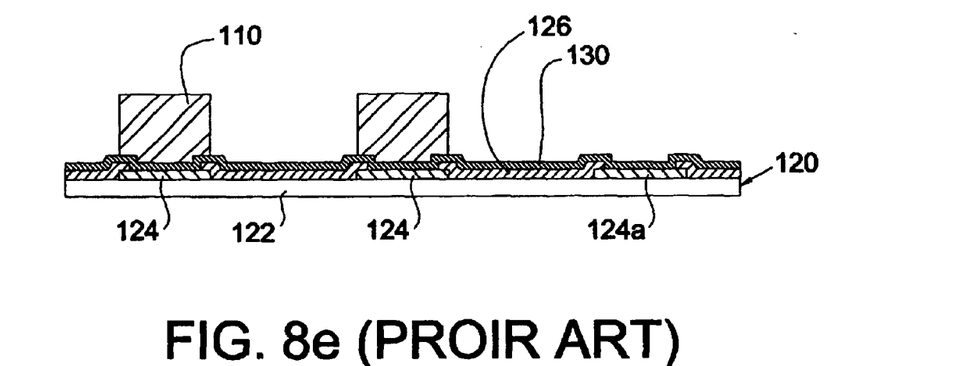
Figure 8F:
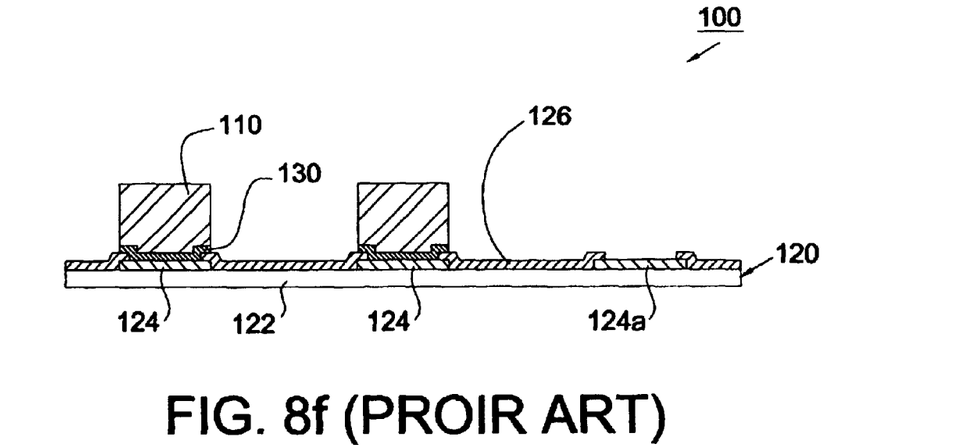

A conventional semiconductor device 100 comprising a plurality of bump electrodes 110 provided on a chip 120 is shown in a cross-sectional view in FIG. 8f. As shown in FIG. 8a, the chip 120 comprises a substrate 122 and a plurality of I/O contact pads 124 protected by a passivation layer 126. The chip 120 also includes a test contact pad 124a configured to permit testing of the chip 120. Bumping technology typically comprises (a) forming an under bump metallurgy (UBM) 130 on contact pads 124 of the chip, and (b) forming bump electrodes 110 on the UBM. It is noted that the test contact pad 124a is not provided with any bump electrode as well as UBM. A suitable bumping technology based on an electroplating method for fabricating the semiconductor device 100 is as follows. First, a continuous "under bump metallurgy" (UBM) layer 130 (see FIG. 8b) is formed on the pads and on the substrate between the pads. Thereafter, bump electrodes 110 are plated on the UBM layer through photoresist application (see FIG. 8c) and its patterning (see FIG. 8d).

After the photoresist pattern is stripped (see FIG. 8e), the excess UBM layer that are not covered by the bump electrodes 110 are etched away to obtain the semiconductor device 100 as shown in FIG. 8f. Specifically, the excess UBM layer can be selectively removed using etchants which attack the UBM layer preferentially with respect to the bump electrodes. However, over-etching caused by the need to completely etch away the excess UBM layer often results in attacking of the test contact pad 124a by the etchant, thereby causing damage to the circuit inside the chip. Besides, the over-etching problem even gets worse when the test contact pad 124a is not completely covered by the UBM layer due to poor step coverage of UBM sputtering process.

SUMMARY OF THE INVENTION

The present invention seeks to provide semiconductor devices and manufacturing methods that can overcome, or at least reduce the above-mentioned problems of the prior art. In a general aspect of the present invention, the semiconductor device comprises a substrate having contact pads each covered by under bump metallurgy and a plurality of bump electrodes respectively provided on the under bump metallurgy covering the contact pads. Typically, each contact pad has at least a portion exposed through the dielectric layer on the substrate. The bump electrode may be a gold bump, and the under bump metallurgy may comprise a barrier layer of TiW formed on the contact pad and a seed layer of gold formed on the barrier layer.

According to one embodiment of the present invention, the semiconductor device is characterized by having at least one contact pad (e.g., a test contact pad) which is not provided with any bump electrode but still has under bump metallurgy provided thereon. In this embodiment, a suitable method of manufacturing the aforementioned semiconductor device is as follows. First, an under bump metallurgy layer is formed on the substrate such that the under bump metallurgy layer covers the exposed portion of each contact pad and extends over the dielectric layer on the substrate. Then, bump electrodes are selectively formed on the under bump metallurgy layer at locations corresponding to the contact pads wherein at least one contact pad (e.g., a test contact pad) is not provided with any bump electrode. Thereafter, a specific photoresist pattern is formed with some portion on the bump electrodes and some portion on the under bump metallurgy layer at a location corresponding to the at least one contact pad without any bump electrode provided thereon. After the under bump metallurgy layer is etched with the bump electrodes and the photoresist pattern as a mask, the photoresist pattern is removed thereby obtaining the semiconductor device described above. It is noted that the photoresist pattern has a portion formed on the contact pad without any bump electrode provided thereon to prevent over-etching thereby allowing removal of the excess UBM layer without causing damage to the circuit inside the chip.

According to another embodiment of the present invention, the semiconductor device is characterized by having at least a conductive line formed of the same material as the under bump metallurgy for interconnecting at least two of the contact pads. The conductive line may be used to interconnect two I/O contact pads for combining signal output. In this embodiment, a suitable method of manufacturing the aforementioned semiconductor device is as follows. First, an under bump metallurgy layer is formed on the substrate in substantially the same way as discussed above. Then, bump electrodes are selectively formed on the under bump metallurgy layer at locations corresponding to the contact pads. Thereafter, a specific photoresist pattern is formed to have some portion on the bump electrodes and some portion on the under bump metallurgy layer at a location between at least two of the contact pads such that the conductive line is formed during the step of etching the under bump metallurgy layer with the bump electrodes and the photoresist pattern as a mask. Finally, the photoresist pattern is removed. Alternatively, the conductive line may be used to interconnect an I/O contact pad and a contact pad without any bump electrode provided thereon. Furthermore, the conductive line may be used to interconnect two contact pads without any bump electrode provided thereon.

According to a further embodiment of the present invention, the semiconductor device is characterized by having a power plane directly formed on a semiconductor chip for supplying the source voltage. The power plane may comprise a first metal layer formed of the same material as the under bump metallurgy and a second metal layer formed of the same material as the bump electrodes. In this embodiment, a suitable method of manufacturing the aforementioned semiconductor device is as follows. First, an under bump metallurgy layer is formed on a semiconductor chip such that the under bump metallurgy layer covers the exposed portion of each contact pad of the chip and extends over the active surface of the chip. Then, bump electrodes are selectively formed on the under bump metallurgy layer at locations corresponding to the contact pads and a metal layer of the same material as the bump electrode is formed on the under bump metallurgy layer. Finally, the under bump metallurgy layer is etched with the bump electrodes and the metal layer as a mask, wherein the metal layer and the under bump metallurgy underneath the metal layer constitute the power plane. Alternatively, the power plane may consist of only a metal layer of the same material as the under bump metallurgy. This structure can be implemented by forming a photoresist pattern on the under bump metallurgy layer, and etching the under bump metallurgy layer with the bump electrodes and the photoresist pattern as a mask such that the under bump metallurgy underneath the photoresist pattern remains intact as the power plane.

According to still a further embodiment of the present invention, the semiconductor device is characterized by having a conductive line for interconnecting at least two of the contact pads, wherein the conductive line comprises a first metal layer formed of the same material as the under bump metallurgy and a second metal layer formed of the same material as the bump electrodes. In this embodiment, a suitable method of manufacturing the aforementioned semiconductor device is as follows. First, an under bump metallurgy layer is formed on the substrate in substantially the same wavy as discussed above. Then, bump electrodes are selectively formed on the under bump metallurgy layer at locations corresponding to the contact pads and a metal layer of the same material as the bump electrode is formed on the under bump metallurgy layer at a location between at least two of the contact pads. Finally, the under bump metallurgy layer is etched with the bump electrodes and the metal layer as a mask, wherein the metal layer and the under bump metallurgy underneath the metal layer function as a conductive line for interconnecting the at least two contact pads.

BRIEF DESCRIPTION OF THE DRAWINGS

Other objects, advantages, and novel features of the invention will become more apparent from the following detailed description when taken in conjunction with the accompanying drawings.

FIG. 1b is across-sectional view taken along line 1b—1b of FIG. 1a,

FIG. 6b is a cross-sectional view taken alone line 6b—6b of FIG. 6a;

FIG. 7b is a cross-sectional view taken along line 7b—7b of FIG. 7a; and

DETAILED DESCRIPTION OF THE PREFERRED EMBODIMENT

Figure 1A:
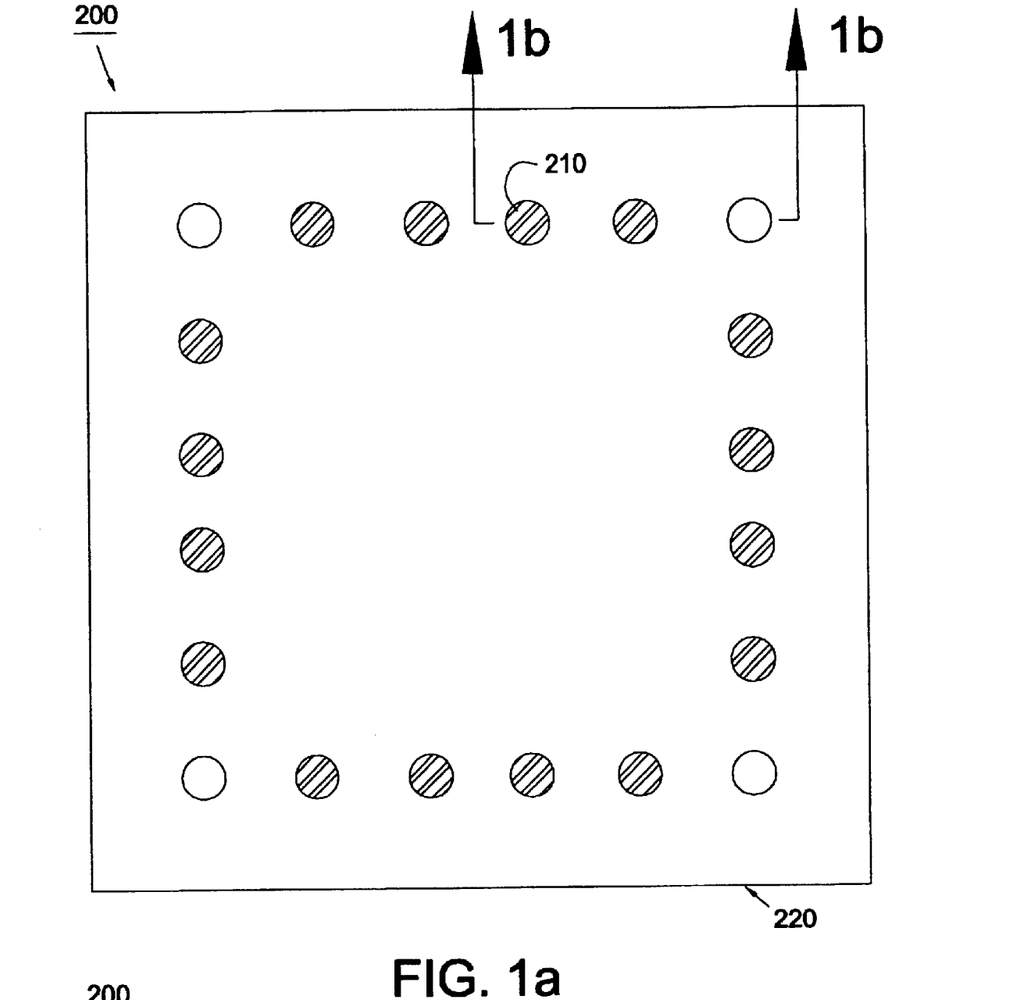
FIG. 1a is a top plan view of a semiconductor device according to one embodiment of the present invention.
Figure 1B:
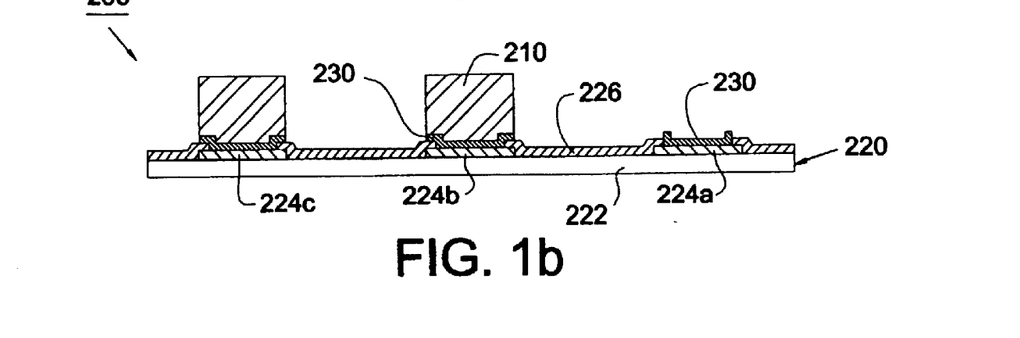

FIGS. 1a–1e, FIGS. 6a–6e and FIGS. 7a–7b illustrate the semiconductor devices according to different embodiments of the present invention, and similar components have been given the same reference numerals. As shown in FIG. 1a, a semiconductor device 200 according to one embodiment of the present invention comprises a plurality of bump electrodes 210 provided on a semiconductor chip 220. As shown, the bump electrodes 210 are typically arrayed in a matrix pattern. The actual number of bump, electrodes varies according to the electrical functions and characteristics of the semiconductor chip, but commonly ranges from approximately ten to as many as several hundred. As shown in FIG. 1b, the chip 220 comprises a substrate 222 and a plurality of contact pads 224a, 224b, 224c protected by a dielectric layer such as passivation layer 226. The passivation layer 226 is preferably a polyimide layer but can alternately be a silicon dioxide layer, a silicon nitride layer, or layers of other passivation materials known to those having skill in the art. Each of the contact pads 224a, 224b, 224c is covered by under bump metallurgy,. i.e., UBM 230 (see FIG. 1b) and the bump electrodes 210 are respectively provided on the UBM 230 covering the contact pads. The substrate 222 may be formed of a layer of a semiconducting material such as silicon, gallium arsenide, silicon carbide, diamond, or other substrate materials known to those having skill in the art. The substrate 222 comprises a plurality of electronic devices such as transistors, resistors, capacitors and inductors which are designed to electrically connect with other devices through I/Os such as the contact pads 224b, 224c.

As shown in FIGS. 1a and 1b, the semiconductor device 200 is characterized by having at least one contact pad 224a which is not provided with any bump electrode 110 but still has UBM 230 (not shown in FIG. 1a) thereon. The contact pad 224a may be a test contact pad configured to permit testing of the chip 220. A suitable but non-limiting method of manufacturing the semiconductor device 200 is described herein in connection with FIGS. 2a–2f of the drawings.

Figure 2A:
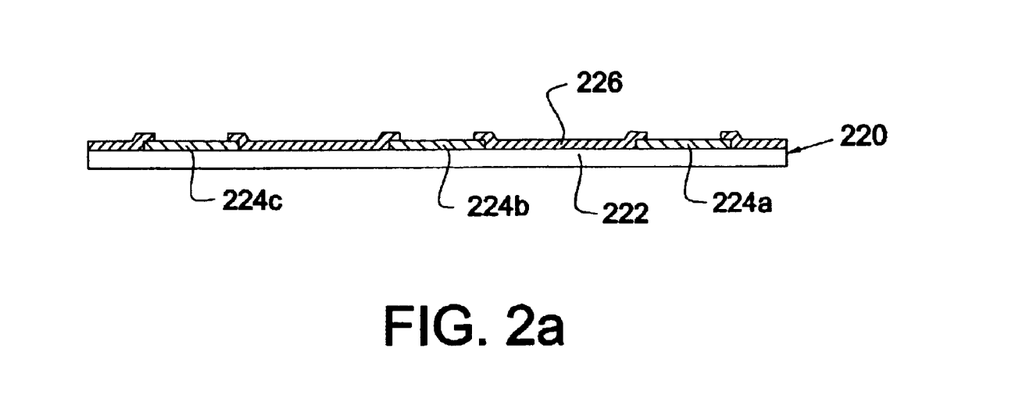
FIGS. 2a–2f illustrate in cross-section major steps of fabrication of the semiconductor device shown in FIG. 1b.

Referring to FIG. 2a, a semiconductor chip 220 comprising a substrate 222, contact pads 224a, 224b, 224c and a passivation layer 226 is used. As shown, the passivation layer 226 preferably covers the top edge portion of each contact pad opposite the substrate, leaving the central surface portion of each contact pad exposed from the passivation layer. The semiconductor chip 220 may be provided in the form of a wafer incorporating a plurality or chips, all of the same design or of different designs.

Figure 2B:
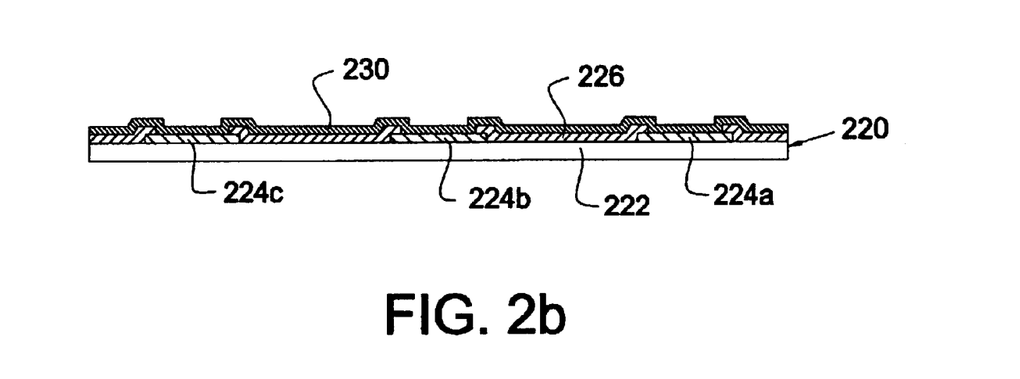

Referring to FIG. 2b, a UBM layer 230, preferably having a stacked structure including a barrier layer of TiW and a seed layer of gold (not shown), is formed on the chip 220 such that the UBM layer 230 covers the exposed portion of each contact pad and extends over the passivation layer 226 of the chip 220, in order to allow current flow during a subsequent plating step. Specifically, a barrier layer of TiW is sputtered to deposit across the passivation layer 226 including the exposed surface portions of the contact pads 224a, 224b, 224c, and a seed layer of gold is sputtered to deposit on the barrier layer.

Figure 2C:
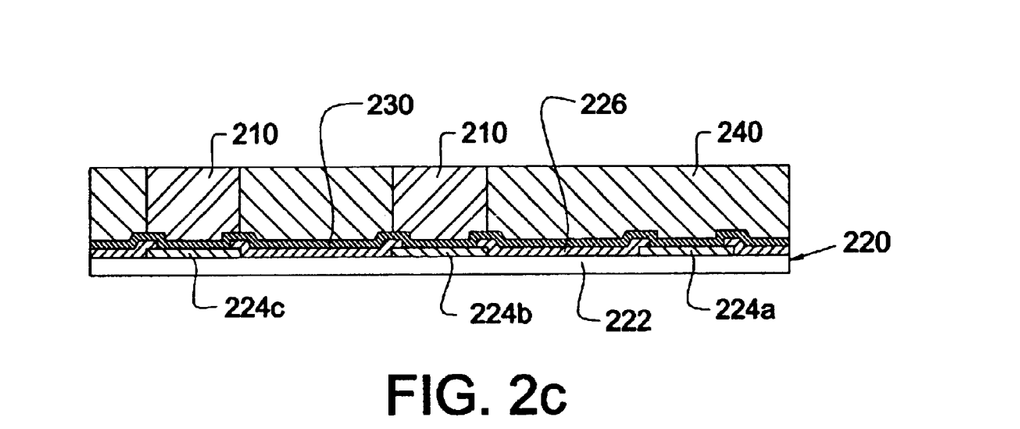
Figure 2D:
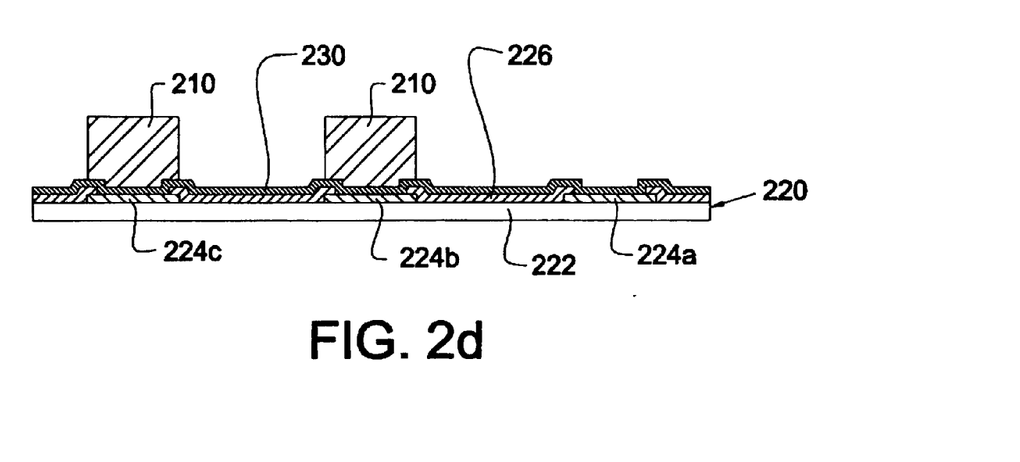

Referring to FIG. 2c, after applying a layer or photoresist 240 and patterning the photoresist layer, gold (or solder) is electrodeposited on the photoresist opening section to obtain the bump electrodes 210; thereafter, the remaining photoresist is stripped (See FIG. 2d). It is noted that the contact pad 224a is not provided with any bump electrode.

Figure 2E:
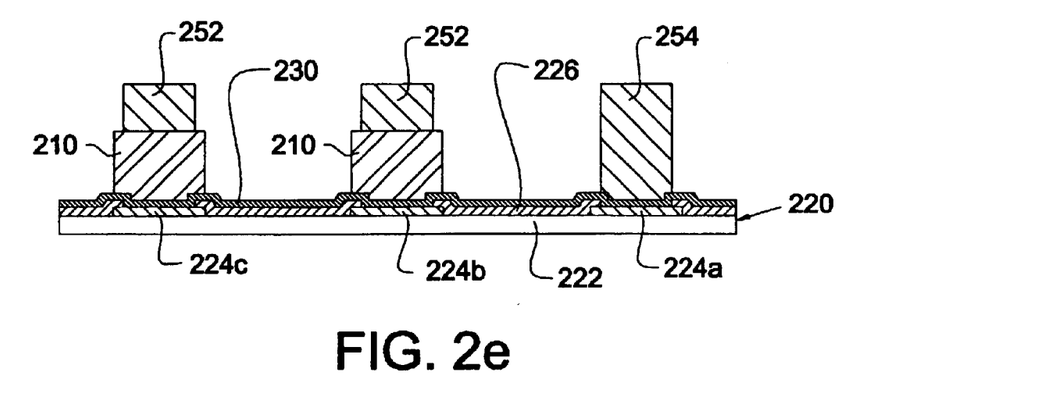

Referring to FIG. 2e, a photoresist layer mainly composed of a resin mixture, and a photoactive material that makes the photoresist layer photodetinable is formed by conventional techniques such as printing, and then the photoresist layer is photoimaged and developed to form a photoresist pattern including a first portion 252 on the bump electrodes 210 and a second portion 254 on the UBM layer at a location corresponding to the contact pad 224a without any bump electrode provided thereon. It should be understood that the photoimaging step might be accomplished by utilizing the photomask used to define the passivation openings thereby significantly reducing the manufacturing cost thereof.

Figure 2F:
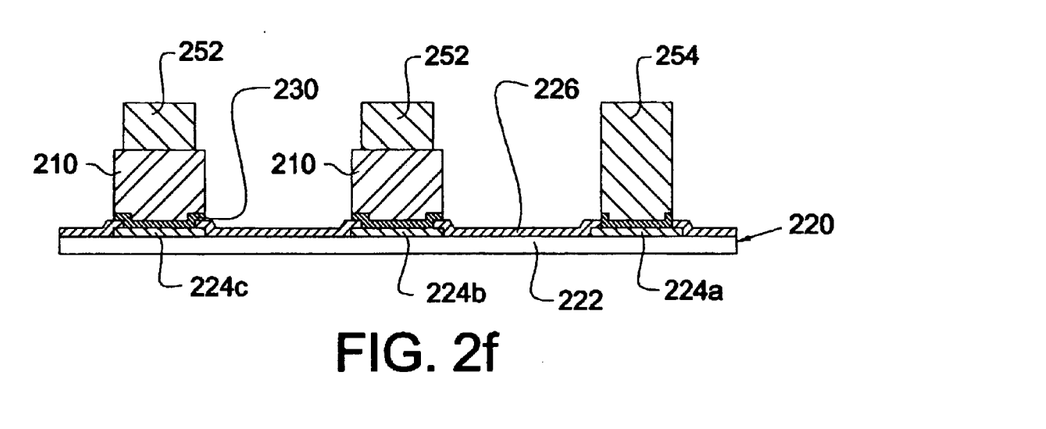

Referring to FIG. 2f, the UBM layer 230 are etched with the bump electrodes 210 and the photoresist pattern as a mask; thereafter, the remaining photoresist is stripped to obtain the semiconductor device 200 as best shown in FIG. 1b. Specifically, the excess UBM layer 230 that are not covered by the bump electrodes 210 and the photoresist pattern can be selectively removed using etchants which attack the UBM layer 230 preferentially with respect to the bump electrodes. It is noted that the second portion 254 of the photoresist pattern protects the contact pad 224a without any bump electrode provided thereon. Therefore, the second portion 254 of the photoresist pattern can significantly reduce the over-etching problem caused by the need to completely etch away the excess UBM layer thereby allowing removal of the excess UBM layer without causing damage to the circuit inside the chip.

Figure 1C:
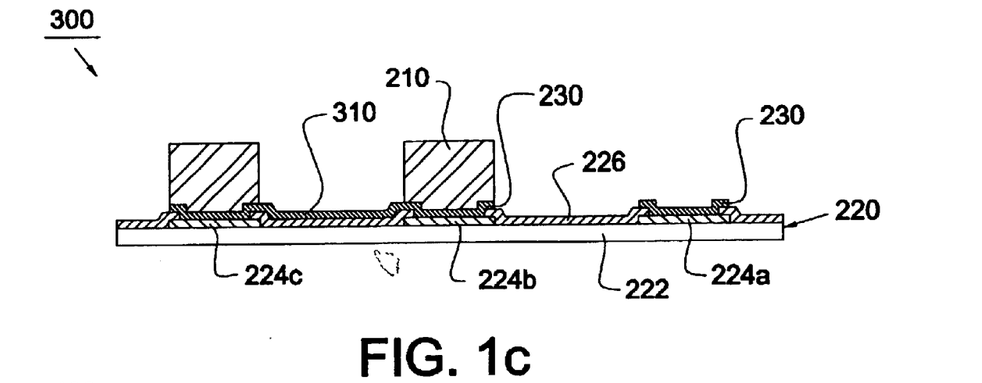
FIG. 1c is a cross-sectional view of a semiconductor device according to another embodiment of the present invention.
Figure 3A:
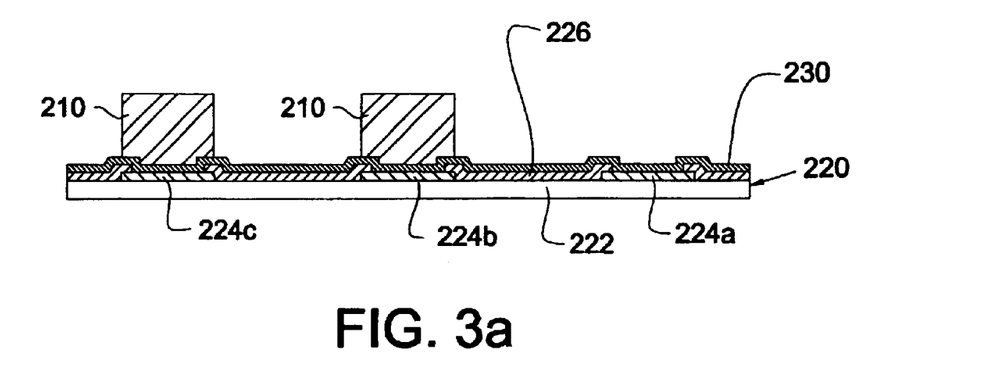
FIGS. 3a–3c illustrate in cross-section major steps of fabrication of the semiconductor device shown in FIG. 1c.
Figure 3B:
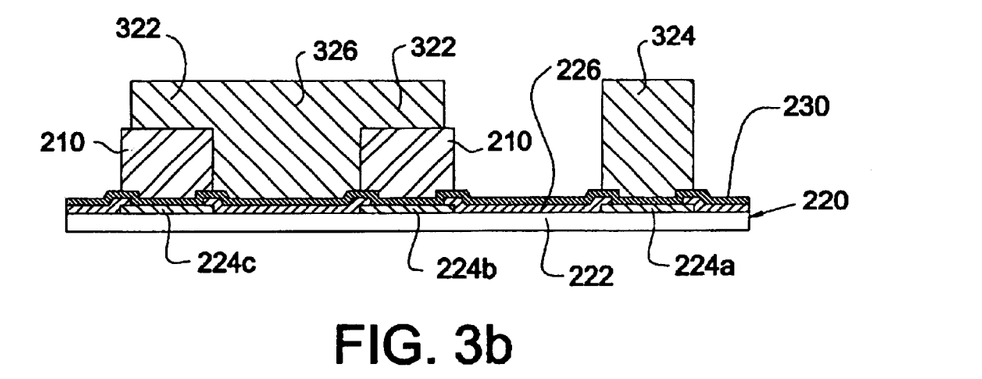
Figure 3C:
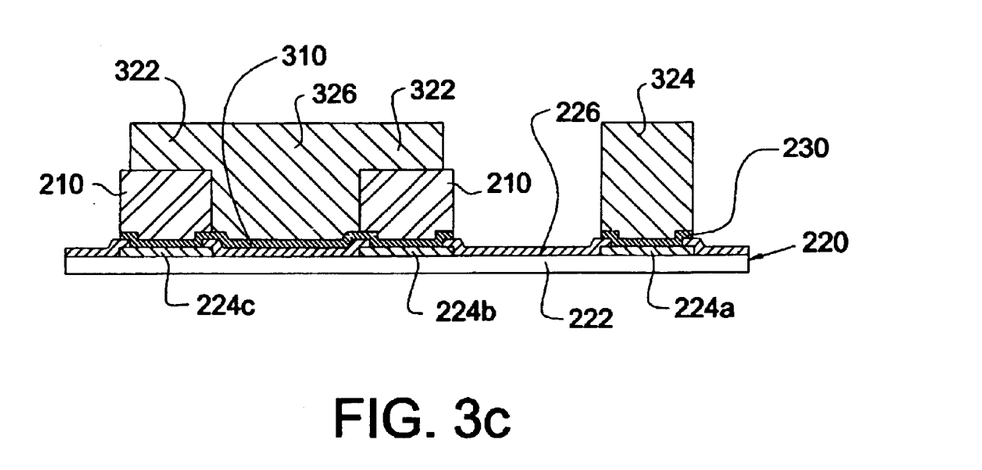

FIG. 1c shows a semiconductor device 300 according to another embodiment of the present invention. As shown, the semiconductor device 300 is characterized by having at least a conductive line 310 for interconnecting the contact pads 224b, 224c. It is noted that the conductive line 310 is formed of the same material as the under bump metallurgy 230. In this embodiment, the conductive line 310 is used to interconnect two I/O contact pads 224b, 224c for combining signal output. A suitable but non-limiting method of manufacturing, the semiconductor device 300 is described herein in connection with FIGS. 3a–3c of the drawings. Referring to FIG. 3a, an UBM layer 230 is formed on the substrate and then bump electrodes 210 are selectively formed on the UBM layer 230 at locations corresponding to the contact pads 224b, 224c in substantially the same way as discussed above. Referring to FIG. 3b, a specific photoresist pattern is formed to have a first portion 322 on the bump electrodes 210, a second portion 324 corresponding to the contact pad 224a, and a third portion 326 on the UBM layer 230 at a location between the contact pads 224b, 224c. Referring to FIG. 3c, the UBM layer 230 are etched with the bump electrodes 210 and the photoresist pattern as a mask thereby forming the conductive line 310, thereafter, the remaining photoresist is stripped to obtain the semiconductor device 300 shown in FIG. 1c.

Figure 1D:
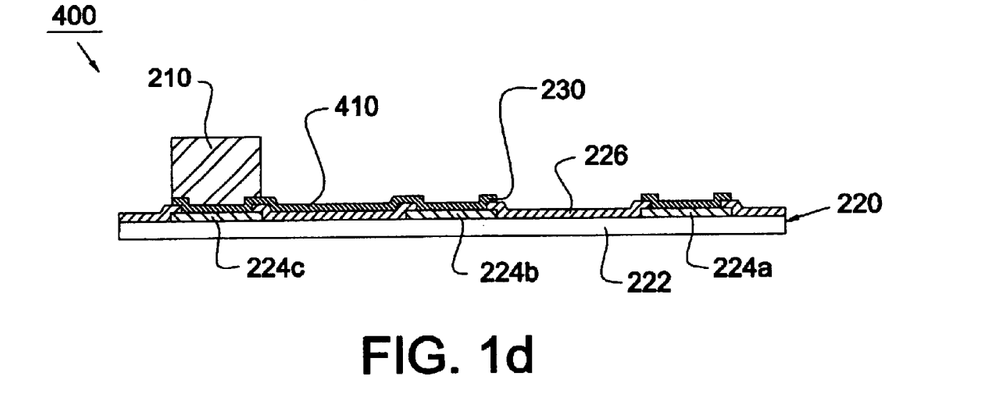
FIG. 1d is a cross-sectional view of a semiconductor device according to another embodiment of the present invention.
Figure 4A:
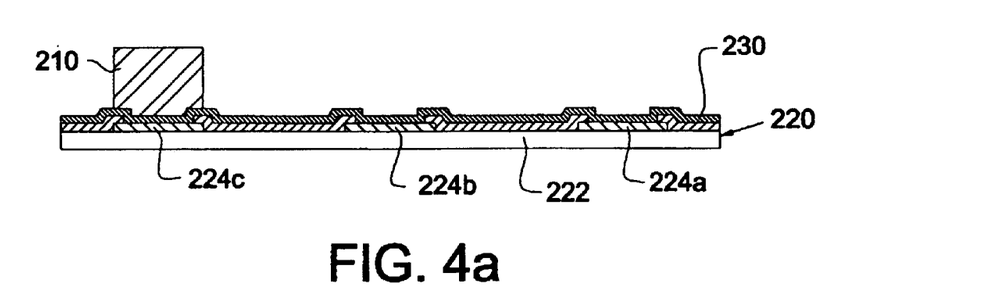
FIGS. 4a–4c illustrate in cross-section major steps of fabrication of the semiconductor device shown in FIG. 1d.
Figure 4B:
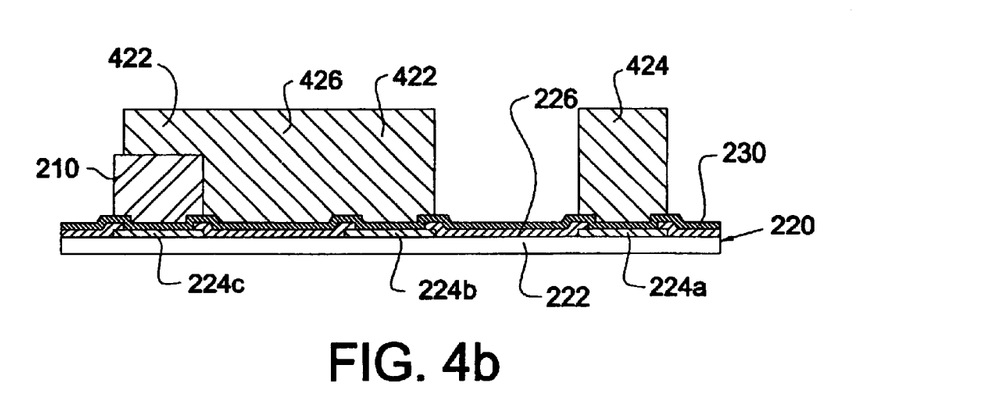
Figure 4C:
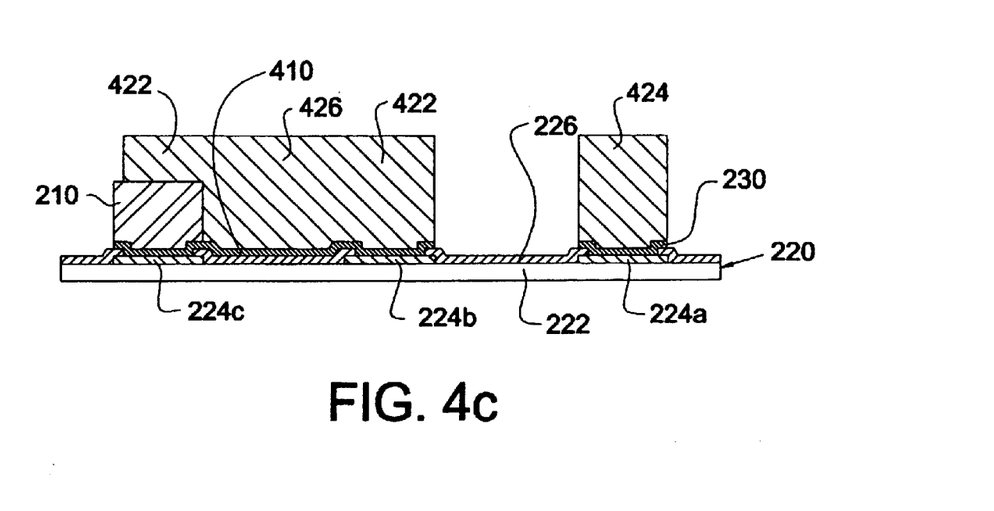

FIG. 1d shows a semiconductor device 400 according to another embodiment of the present invention. As shown, the semiconductor device 400 is characterized by having, at least a conductive line 410 for interconnecting the contact pad 224c and the contact pad 224b without any bump electrode provided thereon. It is noted that the conductive line 310 is formed of the same material as the under bump metallurgy 230. A suitable but non-limiting method of manufacturing the semiconductor device 400 is described hereing in connection with FIGS. 4a–4c of the drawings. Referring to FIG. 4a, an UBM layer 230 is formed on the substrate and then bump electrodes 210 (only one shown in FIG. 4a) are selectively formed on the UBM layer 230 at locations corresponding to the contact pads in substantially the same way as discussed above. It is noted that, in this embodiment, contact pads 224a, 224b are not provided with any bump electrode. Referring to FIG. 4b, a specific photoresist pattern is formed to have a first portion 422 on the bump electrodes 210, a second portion 424 corresponding to the contact pad 224a, 224b, and a third portion 426 on the UBM layer 230 at a location between the contact pads 224. Referring to FIG. 4c, the UBM layer 230 are etched with the bump electrodes 210 and the photoresist pattern as a mask thereby forming the conductive line 410; thereafter, the remaining photoresist is stripped to obtain the semiconductor device 400 shown in FIG. 1d.

Figure 1E:
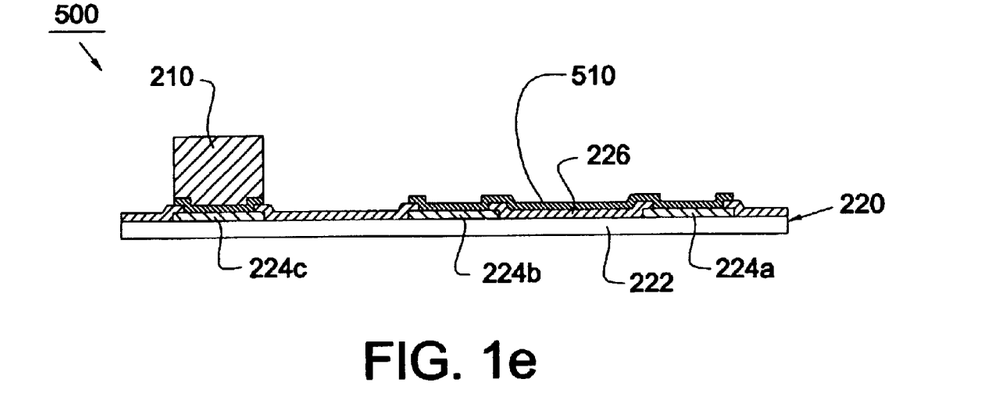
FIG. 1e is a cross-sectional view of a semiconductor device according to another embodiment of the present invention.
Figure 5A:
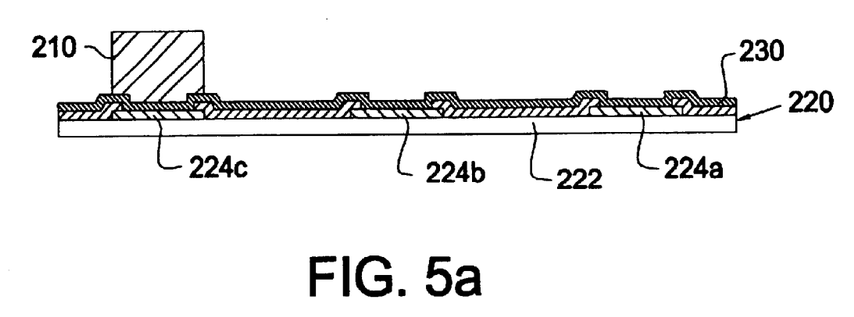
FIGS. 5a–5c illustrate in cross-section major steps of fabrication of the semiconductor device shown in FIG. 1e.
Figure 5B:
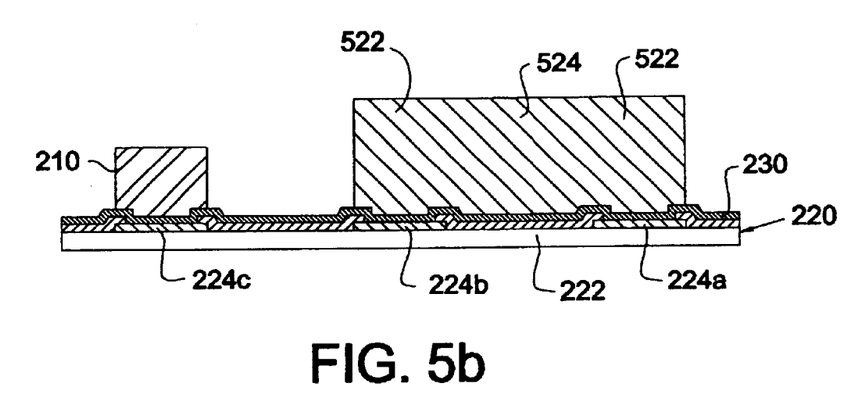
Figure 5C:
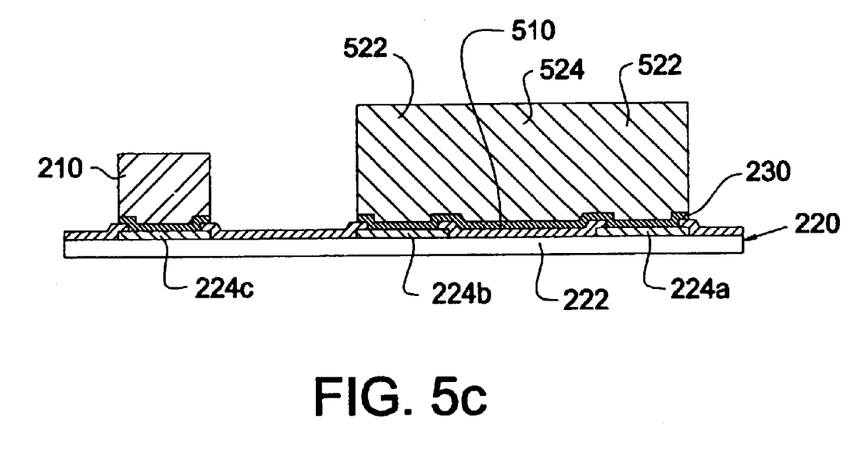

FIG. 1e shows a semiconductor device 500 according to another embodiment of the present invention. As shown, the semiconductor device 500 is characterized by having at least a conductive line 510 for interconnecting the contact pad 224a, 224b without any bump electrode provided thereon. It is noted that the conductive line 310 is formed of the same material as the under bump metallurgy 230. A suitable but non-limiting, method of manufacturing the semiconductor device 500 is described herein in connection with FIGS. 5a–5c of the drawings. Referring to FIG. 5a, an UBM layer 230 is formed on the substrate and then bump electrodes 210 (only one shown in FIG. 5a) are selectively formed in substantially the same way as discussed in connection with FIG. 4a, wherein at least two contact pads 224a, 224b are not provided with any bump electrode. Referring to FIG. 5b, a specific photoresist pattern is formed to have a first portion 522 corresponding to the contact pads 224a, 224b, and a second portion 524 on the UBM layer 230 at a location between the contact pads 224a, 224b. Referring to FIG. 5c, the UBM layer 230 are etched with the bump electrodes 210 and the photoresist pattern as a mask thereby forming the conductive line 510; thereafter, the remaining photoresist is stripped to obtain the semiconductor device 500 shown in FIG. 1e.

Figure 6A:
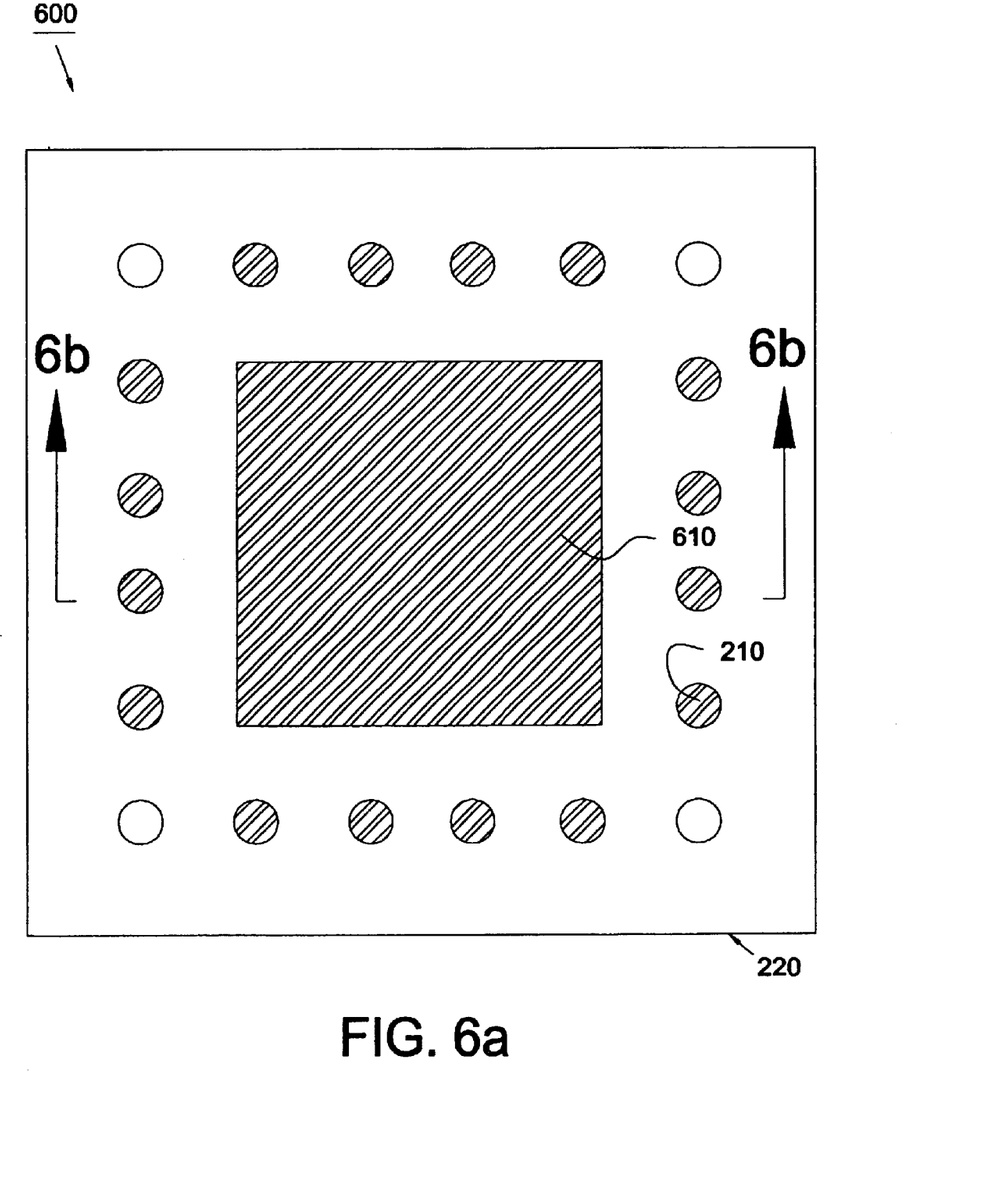
FIG. 6a is a top plan view of a semiconductor device according to another embodiment of the present invention.
Figure 6B:
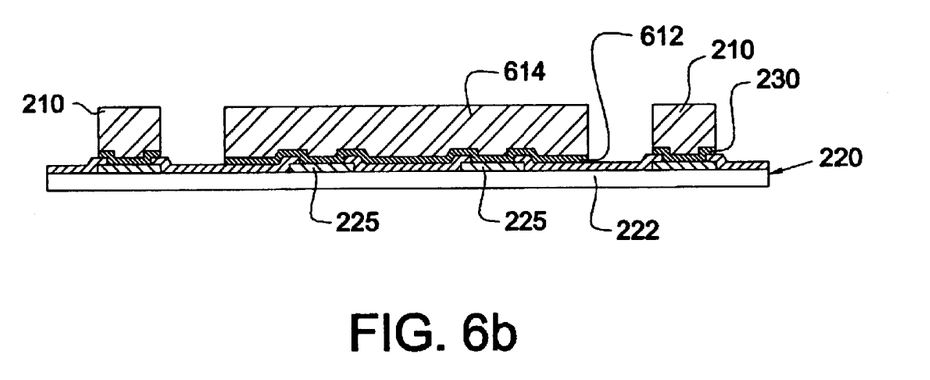
Figure 6C:
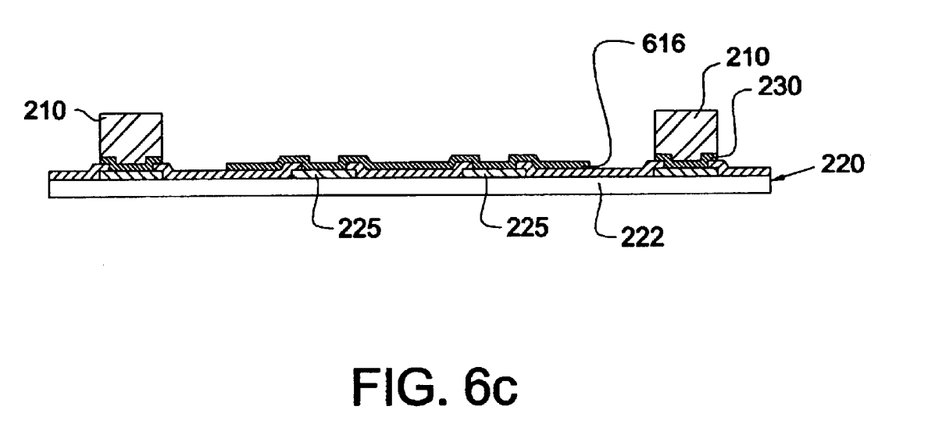
FIG. 6c is a cross-sectional view of a semiconductor device according to another embodiment of the present invention.

FIG. 6a shows a semiconductor device 600 according to another embodiment of the present invention. As shown, the semiconductor device 600 is characterized by having a power plane 610 directly formed on the semiconductor chip 220 for supplying the source voltage. Referring to FIG. 6b, the power plane 610 may comprise a first metal layer 612 formed of the same material as the UBM 230 and a second metal layer 614 formed of the same material as the bump electrodes 210. A suitable but non-limiting method of manufacturing the semiconductor device 600 is as follows. First, an UBM layer is formed on the entire surface of the semiconductor chip 220. Then, in substantially the same way as discussed in connection with FIG. 2c, the bump electrodes 210 are selectively formed on the UBM layer at locations corresponding to the contact pads and the metal layer 614 is formed on the UBM layer. Finally, the UBM layer is etched with the bump electrodes 210 and the metal layer 614 as a mask, wherein the metal layer 614 and the under bump metallurgy underneath the metal layer, i.e., the metal layer 612, constitute the power plane 610. Alternatively, as shown in FIG. 6c, the power plane 610 may consist of only a metal layer 616 of the same material as the UBM 230. This structure of FIG. 6c can be implemented by forming, a photoresist pattern on the UBM layer, and etching the UBM layer with the bump electrodes and the photoresist pattern as a mask such that the UBM underneath the photoresist pattern, i.e., the metal layer 616, remains intact as the power plane. There are a plurality of contact pads 225 (only two shown in FIG. 6b and FIG. 6c) underneath the power plane 610 (i.e., underneath the metal layer 612 or the metal layer 616), therefore source voltage from the power plane 610 can be applied to the semiconductor device 600 through the pads 225.

Figure 7A:
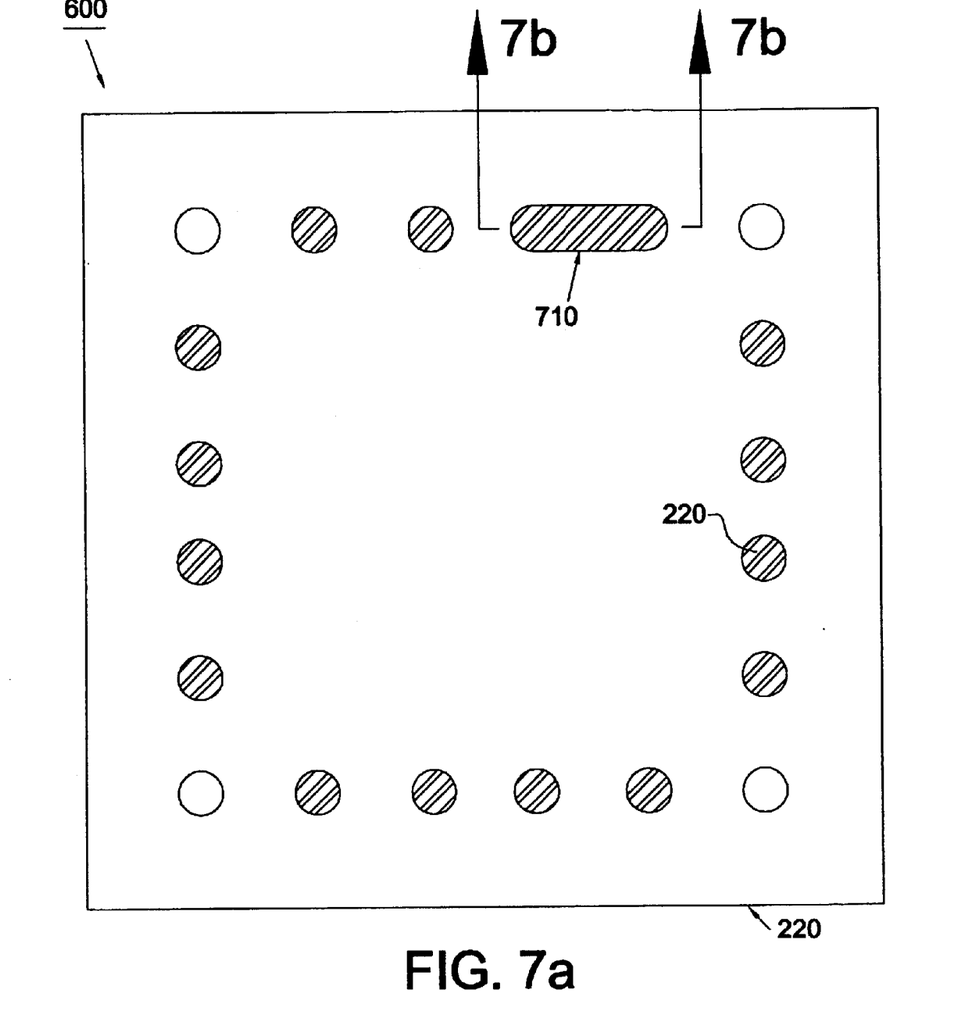
FIG. 7a is a top plan view of a semiconductor device according to another embodiment of the present invention.
Figure 7B:
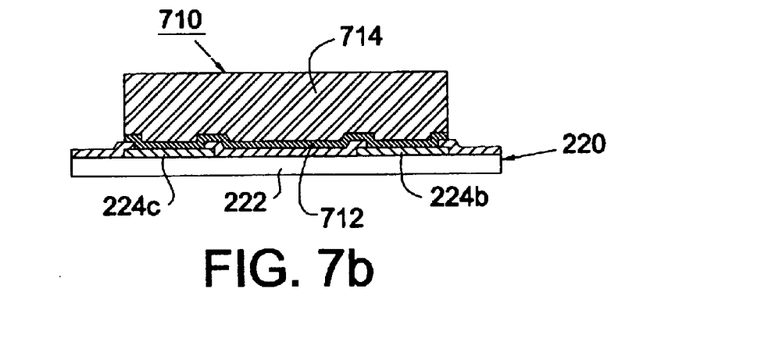

FIGS. 7a–7b shows a semiconductor device 700 according to another embodiment of the present invention. As shown, the semiconductor device 700 is characterized by having a conductive line 710 for interconnecting the contact pads 224b, 224c. The conductive line 710 comprises a first metal layer 712 formed of the same material as the under bump metallurgy and a second metal layer 714 formed of the same material as the bump electrodes. A suitable but non-limiting method of manufacturing the semiconductor device 700 is as follows. First, an UBM layer is formed on the entire surface of the chip 220 in substantially the same way as discussed above. Then, in substantially the same way as discussed in connection with FIG. 2c, the bump electrodes 210 are selectively formed on the UBM layer at locations corresponding to the contact pads and the metal layer 714 is formed on the UBM layer. Finally, the under bump metallurgy layer is etched with the bump electrodes 210 and the metal layer 714 as a mask such that the UBM underneath the metal layer 714, i.e., the metal layer 712, remains intact as a portion of the conductive line 710.

It could be understood that the conductive lines 310, 410, 510, 710 of the present invention may be a part of a desired trace pattern formed in substantially the same way to interconnect the contact pads of the chip 220 into a desired format.

Although the invention has been explained in relation to its preferred embodiments, it is to be understood that many other possible modifications and variations can be made without departing from the spirit and scope of the invention as hereinafter claimed.

What is claimed is:

1. A semiconductor device comprising:
   a substrate having a dielectric layer formed thereon;
   a plurality of contact pads on the substrate wherein at least a portion of the contact pad is exposed through the dielectric layer on the substrate;
   under bump metallurgy covering the exposed portion of each contact pad; and
   a plurality of bump electrodes selectively provided on the under bump metallurgy covering the contact pads, wherein at least one contact pad is not provided with any bump electrode.

2. The semiconductor device as claimed claim 1, wherein the bump electrode is a gold bump, and the under bump metallurgy comprises a barrier layer of TiW formed on the contact pad and a seed layer of gold formed on the barrier layer.

3. The semiconductor device as claimed in claim 1, further comprising a conductive line formed of the same material as the under bump metallurgy for interconnecting at least two of the contact pads.

4. The semiconductor device as claimed in claim 3, wherein the bump electrode is a gold bump, and the under bump metallurgy comprises a barrier layer of TiW formed on the contact pad and a seed layer of gold formed on the barrier layer.

5. The semiconductor device as claimed in claim 3, wherein at least one of the interconnecting contact pads is not provided with any bump electrode.

6. The semiconductor device as claimed in claim 5, wherein the bump electrode is a gold bump, and the under bump metallurgy comprises a barrier layer of TiW formed on the contact pad and a seed layer of gold formed on the barrier layer.

7. The semiconductor device as claimed in claim 1, further comprising another contact pad without any bump electrode provided thereon, and a conductive line formed of the same material as the under bump metallurgy for interconnecting the contact pads without any bump electrode provided thereon.

8. The semiconductor device as claimed in claim 7, wherein the bump electrode is a gold bump, and the under bump metallurgy comprises a barrier layer of TiW formed on the contact pad and a seed layer of gold formed on the barrier layer.

9. The semiconductor device as claimed in claim 1, wherein the substrate comprises a plurality of electronic devices which are designed to electrically connect with an outside circuit through the contact pads.

10. A semiconductor device comprising:
- a semiconductor chip having a dielectric layer formed thereon and a plurality of contact pads wherein at least a portion of the contact pad is exposed through the dielectric layer of the semiconductor chip;
- under bump metallurgy covering the exposed portions of the contact pads;
- a plurality of independent bump electrodes selectively provided on the under bump metallurgy covering the contact pads; and
- a power plane directly formed on the dielectric layer of the semiconductor chip for supplying the source voltage, and electrically connecting at least two of the contact pads.

11. The semiconductor device as claimed in claim 10, wherein the power plane comprises a first metal layer formed of the same material as the under bump metallurgy.

12. The semiconductor device as claimed in claim 10, wherein the bump electrode is a gold bump, and the under bump metallurgy comprises a barrier layer of TiW formed on the contact pad and a seed layer of gold formed on the barrier layer.

13. A semiconductor device comprising:
- a substrate having a dielectric layer formed thereon;
- a plurality of contact pads on the substrate wherein at least a portion of the contact pad is exposed through the dielectric layer on the substrate;
- under bump metallurgy covering the exposed portion of each contact pad;
- a plurality of bump electrodes respectively provided on the under bump metallurgy covering the contact pads; and
- a conductive line formed on the dielectric layer of the substrate for interconnecting at least two of the contact pads.

14. The semiconductor device as claimed in claim 13, wherein the conductive line comprises a first metal layer formed of the same material as the under bump metallurgy.

15. The semiconductor device as claimed in claim 14, wherein the conductive line further comprises a second metal layer formed of the same material as the bump electrodes.

16. The semiconductor device as claimed in claim 13, wherein the bump electrode is a gold bump, and the under bump metallurgy comprises a barrier layer of TiW formed on the contact pad and a seed layer of gold formed on the barrier layer.

17. The semiconductor device as claimed in claim 10, wherein the power plane is directly connected to at least two of the contact pads.

* * * * *

UNITED STATES PATENT AND TRADEMARK OFFICE
CERTIFICATE OF CORRECTION

PATENT NO. : 6,861,749 B2
DATED : March 1, 2005
INVENTOR(S) : Wu et al.

It is certified that error appears in the above-identified patent and that said Letters Patent is hereby corrected as shown below:

Title page,
Item [74], *Attorney, Agent, or Firm*, change "Dunner." to -- Dunner, --.

Column 8,
Line 34, change "claimed claim" to -- claimed in claim --.

Signed and Sealed this

Twelfth Day of July, 2005

JON W. DUDAS
*Director of the United States Patent and Trademark Office*